(12) United States Patent
Witte et al.

(10) Patent No.: US 6,477,690 B1
(45) Date of Patent: Nov. 5, 2002

(54) IN-PLACE REPEATER INSERTION METHODOLOGY FOR OVER-THE-BLOCK ROUTED INTEGRATED CIRCUITS

(75) Inventors: Jeffrey P Witte, Ft Collins, CO (US); Daniel J Dixon, Thornton, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/507,206

(22) Filed: Feb. 18, 2000

(51) Int. Cl.⁷ .............................................. G06F 17/50
(52) U.S. Cl. ........................................... 716/12; 716/14
(58) Field of Search ...................... 716/12–14

(56) References Cited

U.S. PATENT DOCUMENTS

| | | | |
|---|---|---|---|
| 5,196,362 A | * 3/1993 | Suzuki | 437/51 |
| 5,654,898 A | * 8/1997 | Roetcisoender et al. | 364/490 |
| 5,838,538 A | * 11/1998 | Srivatsa | 364/489 |
| 5,859,999 A | 1/1999 | Morris et al. | 395/565 |
| 5,860,017 A | 1/1999 | Sharangpani et al. | 395/800.23 |
| 6,009,253 A | * 12/1999 | Srivatsa et al. | 395/500 |
| 6,145,116 A | * 11/2000 | Tawada | 716/6 |
| 6,198,978 B1 | * 3/2001 | Takahashi | 700/97 |

OTHER PUBLICATIONS

Wolfe, Alexander, "Patents Shed Light on Merced," Electronic Engineering Times, Feb. 15, 1999, pp. 43–44.

Interactive Repeater Insertion Simulator (IRIS) System And Method, Application No. 09/329556, Filed Jun. 10, 1999, Inventor: John D. Wanek.

* cited by examiner

*Primary Examiner*—Vuthe Siek
*Assistant Examiner*—Sun James Lin (57) ABSTRACT

A method and system for performing in-place insertion of interconnect repeaters in an integrated circuit is presented. The integrated circuit comprises a silicon layer and at least one interconnect layer layered over said silicon layer. Metal tracks are reserved on each of the interconnect layers in predefined repeater areas. The interconnects are then routed to pass over the pre-defined repeater areas. For each interconnect, a set of optimal constrained repeater locations are calculated, as defined by the optimal number and locations of repeaters along the interconnect route and as constrained by a set of legal repeater locations associated with the interconnect and which will result in acceptable timing criteria. For each calculated optimal constrained repeater location, a repeater is stitched in-place through the reserved metal tracks of the intervening layers.

5 Claims, 6 Drawing Sheets

IN-PLACE REPEATER INSERTION METHODOLOGY FOR OVER-THE-BLOCK ROUTED INTEGRATED CIRCUITS

FIELD OF THE INVENTION

The present invention pertains generally to interconnect routing in integrated circuit design, and more particularly to a method for inserting in-place interconnect repeaters along over-the-block interconnect paths in integrated circuits.

BACKGROUND OF THE INVENTION

Integrated circuits comprise a plurality of electronic components that function together to implement a higher-level function. ICs are formed by implanting a pattern of transistors into a silicon wafer which are then connected to each other by layering multiple layers of metal materials, interleaved between dielectric material, over the transistors. The fabrication process entails the development of a schematic diagram that defines the circuits to be implemented. A chip layout is generated from the schematic. The chip layout, also referred to as the artwork, comprises a set of planar geometric shapes over several layers that implement the circuitry defined by the schematic. A mask is then generated for each layer based on the chip layout. Each metal is then successively manufactured over the silicon wafer according to the layer's associated mask using a photolithographical technique.

The process of converting the specifications of an electrical circuit schematic into the layout is called the physical design process. CAD tools are extensively used during all stages of the physical design process. The physical design process is accomplished in several stages including partitioning, floorplanning, and routing.

During the partitioning stage, the overall integrated circuit is partitioned into a set of functional subcircuits called blocks. The block partitioning process considers many factors including the number and size of the blocks, and number of interconnections between the blocks. The output of partitioning is a set of blocks along with a set of interconnections required between blocks, referred to herein as a netlist.

During the floorplanning stage, a floorplan is developed defining the placement and rectangular shape of each block. The goal of the floorplanning stage is to select the optimal layout for each block, as well as for the entire chip.

Once an acceptable floorplan is developed, the interconnections between the blocks (as defined by the netlist) are routed. The space not occupied by the blocks is partitioned into rectangular regions referred to as channels. Interconnects are preferably routed within the designated channels, but may also be routed through defined feedthroughs through the blocks, or in defined over-the-block routing space.

The goal of a router is to complete all circuit connections resulting in minimal interconnect signal delay. Where possible, the router will generally attempt to route individual interconnects on a single layer; however, if this is not achievable given the topology of the netlist, an interconnect may be routed over two or even more layers. Often, interconnect routes resulting from the autorouting will be too long to meet signal delay specifications. The delay results from the inherent RC characteristics of the interconnect line. Signal transition time can often be significantly improved by introducing one or more signal repeaters along the path of the interconnect line.

Over the past decades, integrated circuits (ICs) of increasingly higher density have been developed to meet industry demands of higher performance and smaller packaging. The very high densities of today's integrated circuits means that more metal layers and interconnects per layer are required than ever before. The result is that the routing task has become even more complex, often resulting in a higher number of interconnects that do not meet the timing criteria, and therefore an increasingly higher number of required repeaters. When over-the-block routing is employed, the insertion of repeaters along the over-the-block interconnects is problematic due to the need to be able to connect from the metal layer on which the problem interconnect resides, through any intervening layers, to the repeaters ports.

On previous channel-routed ICs, the conventional process for inserting repeaters involved the process of routing the interconnects without insertion of repeaters, extracting the timing for the interconnects, determining the placement of repeaters to improve unacceptable timing paths (usually by simulating with a CAD tool such as SPICE), and adding the repeaters one at a time to the schematic and artwork to create a new netlist. The new netlist was then resubmitted to the router and the process repeated. It will be noted that the second route (with repeaters) typically results in a routing solution that is quite different from the initial route, and therefore often contains unacceptable net propagation delays due to the re-route. In other words, the optimal repeater solution for the initial route will not necessarily be the optimal repeater solution for the second route. Accordingly, the rip-up and re-route process is typically repeated, feeding the router the netlist generated on the previous iteration of the process, until all interconnects satisfactorily meet the timing criteria. Because the previous routing solution is not preserved when the router routes the new netlist, this process is often referred to as "rip-up and re-route".

Importantly, as just described, new repeaters are added to the netlist and schematic on each iteration of the process. Each time a repeater is added to the schematic, two separate new nets replace the original net, one of which connects to the input port of the repeater, and the other of which connects to the output port of the repeater. Accordingly, it will be appreciated that the number of nets and number of connections that the router must route increases by at least two for each repeater inserted. Because the updated netlist with the additional nets and connections is then resubmitted to the router in the prior art, the routing problem faced by the router becomes more complex for each successive iteration of the rip-up and re-route process. For example, suppose the original netlist comprises 15K nets and 30K connections. If after the first iteration the router determines that each net requires one repeater, the new netlist will comprise twice the number of nets and connections (30K nets and 60K connections) as the original netlist. It is clear that the routing problem submitted to the router becomes increasingly difficult on each iteration of the rip-up and re-route process as the netlist gets updated to accommodate new repeaters on each iteration.

It is therefore and object of the invention to eliminate the iterative rip-up and re-route process by providing a methodology for allowing in-place insertion of repeaters along an interconnect.

SUMMARY OF THE INVENTION

The present invention is a novel method and system for inserting in-place interconnect repeaters along over-the-block interconnect paths in integrated circuits. In accordance with the invention, the over-the-block interconnects are routed without repeaters but with some metal reserved for repeater stitching on each intervening layer between the interconnect layer and repeater ports. The ideal number and locations of repeaters for each net which will result in the minimized propagation delay and acceptable signal transition timing are then calculated, considering only those places where the routed signal passes over a pre-determined legal repeater area. The calculated repeaters are stitched into the existing route artwork using the metal previously reserved for repeater stitching, and the repeaters are added to the schematic.

Because only locations where interconnects pass over legal repeater areas are considered, the method of the invention avoids the traditional rip-up and re-route method, thereby simplifying the routing problem submitted to the router, and reducing the time required to reach an acceptable routing solution.

BRIEF DESCRIPTION OF THE DRAWING

The invention will be better understood from a reading of the following detailed description taken in conjunction with the drawing in which like reference designators are used to designate like elements, and in which.

DETAILED DESCRIPTION

A novel method and system for inserting in-place interconnect repeaters along over-the-block interconnect paths in integrated circuits is described in detail hereinafter. Although the invention is described in terms of specific illustrative embodiments, such as specifically identified CAD tools, it is to be understood that scope of the invention is not limited thereby.

Figure 1:
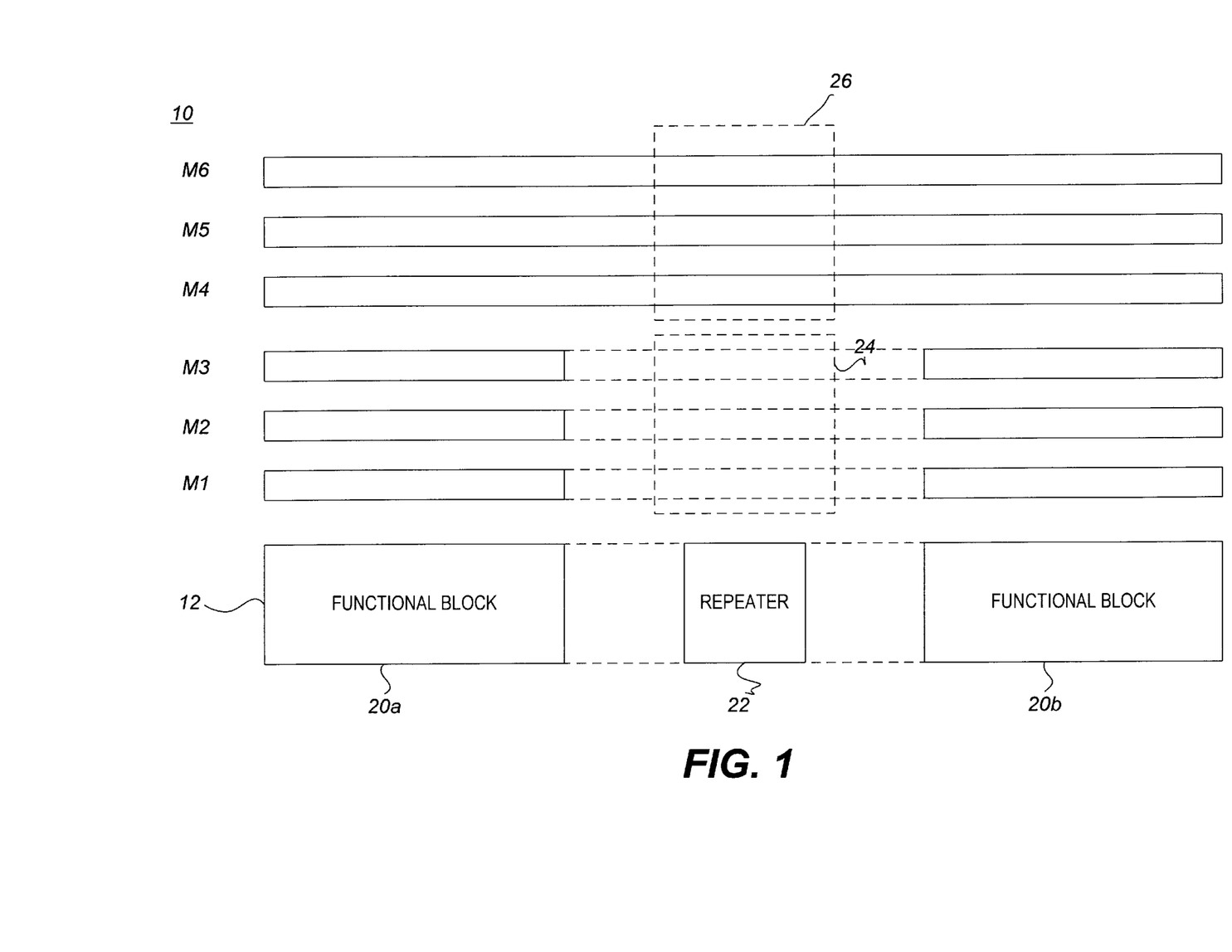
FIG. 1 is a side view of a portion of an integrated circuit implemented in accordance with the invention.

FIG. 1 is a side view of a portion of an integrated circuit (IC) 10. IC 10 comprises functional blocks 20a and 20b implemented in silicon layer 12. Metal layers M1–M6, sandwiched with intervening dielectric layers (not shown), are layered one on top of the other as illustrated. The metal on each layer M1–M6 is preferably formed in parallel tracks, where the direction of the tracks in adjacent layers is orthogonal.

Generally, the lowest level metal layers are used by local block interconnects, i.e., intra-block signals, and higher-level metal layers are used by inter-block interconnects. In the illustrated example, metal layers M1–M3 are used for intra-block routing, while layers M4–M6 are used for inter-block routing.

As described in the background section, repeaters are used to improve propagation delay and signal transition times. In the example of FIG. 1, IC 10 includes repeater buffer 22 implemented in the channel between blocks 20a and 20b. In order for an interconnect net on one of the upper layers M4–M6 to connect to the repeater 22 on the silicon layer, a connection must be made through any intervening metal layers between the net and the ports of the repeater. To make the necessary net-to-port connections, some metal on each layer between the net to be connected and the repeater ports must be set aside especially for this purpose.

It will be appreciated from the diagram of FIG. 1 that tracks over the repeaters 22 on the local interconnect layers M1–M3 (shown generally at 24) are typically available for connection to repeaters since all the intra-block interconnects tend to run directly over-the-block and tend not to run over the neighboring channels. However, in the upper metal layers (e.g., M4–M6), the inter-block interconnects run between the blocks and therefore compete for the resources in the area directly over the repeaters. Therefore, unless metal tracks in the inter-block interconnect layers M4–M6 are specifically set aside on each of those layers for repeater connections, it is unlikely that the necessary resources in these layers will be available for stitching in a repeater after the autorouting is completed.

Figure 2:
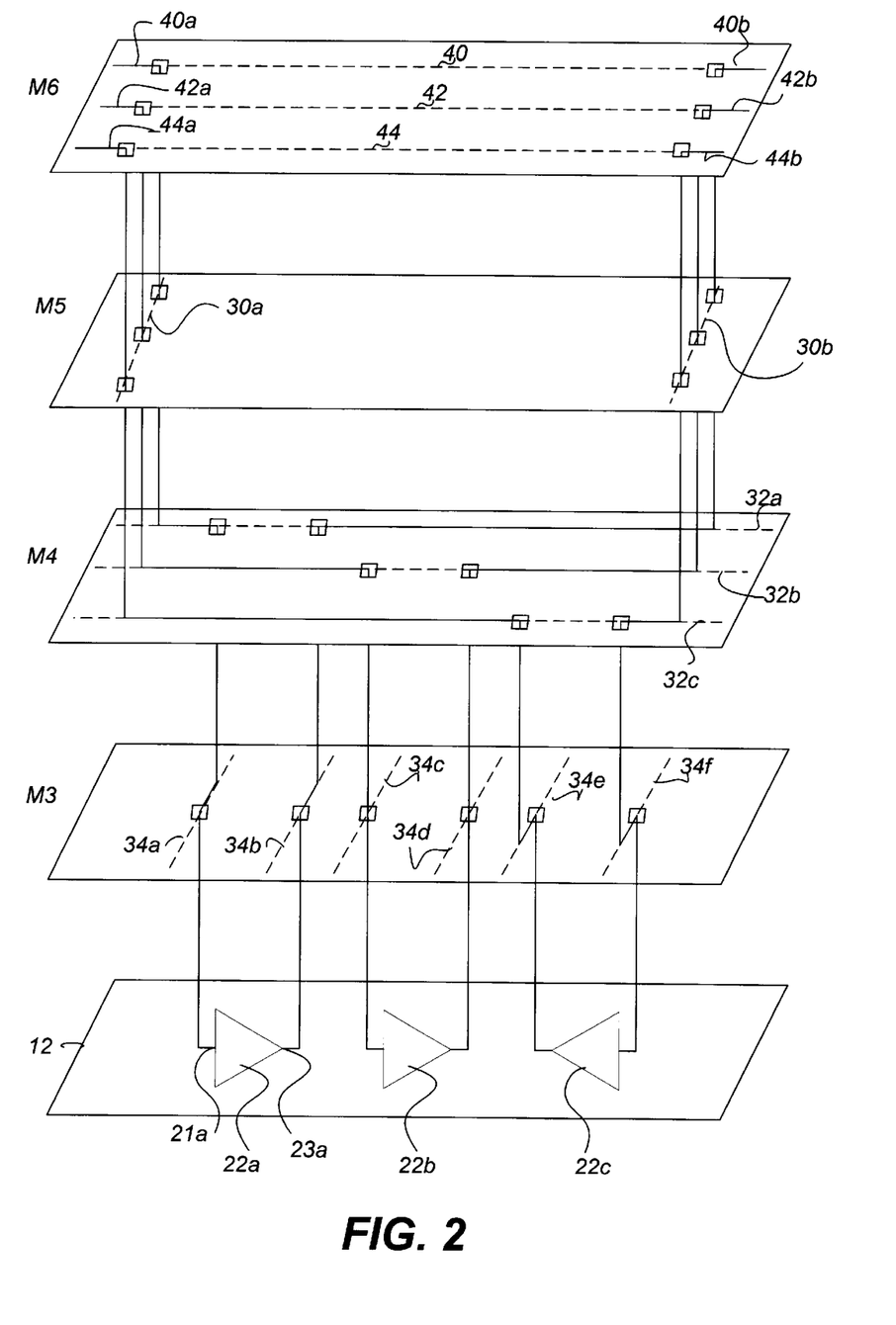
FIG. 2 is a perspective view of a portion of the IC of FIG. 1 with the layers broken-out, which illustrates three repeaters stitched in-place according to the invention.

FIG. 2 is a perspective view of a portion of IC 10 showing the break-out of the different layers. FIG. 2 shows a set of top-level interconnects 40, 42, and 44 located on metal layer M6 stitched to respective repeaters 22a, 22b, 22c. As illustrated, each intervening metal layer M5, M4 and M3 (local layers M2 and M1 are assumed but not shown for simplicity) between the layer M6 on which the interconnect lies and the repeater ports each have tracks set aside specifically for use for interconnect-to-repeater connections. In the example shown in FIG. 2, metal layer M5 comprises set aside tracks 30a and 30b; metal layer M4 comprises set aside tracks 32a, 32b, and 32c; and metal layer M3 comprises set aside tracks 34a, 34b, 34c, 34d, 34e, and 34f. The repeater ports in this example are available at metal layer M3. Layers M2 and M1 comprises similar set aside tracks which complete the connections to the repeaters 22a, 22b, 22c. After stitching, interconnect 40 comprises two separate nets 40a and 40b. Net 40a connects through layers M5 (along set aside track 30a), M4 (along set aside track 32a), M3 (along set aside track 34a), M2 and M1 (not shown), to the input port 21a of repeater 22a. Net 40b connects through layers M5 (along set aside track 30b), M4 (along set aside track 32a), M3 (along set aside track 34b), M2 and M1 (not shown), to the output port 23a of repeater 22a. Interconnects 42 and 44 are similarly separated into separate nets 42a, 42b, and 44a, 44b respectively. They are similarly connected to respective repeaters 22b and 22c as illustrated.

Figure 3:
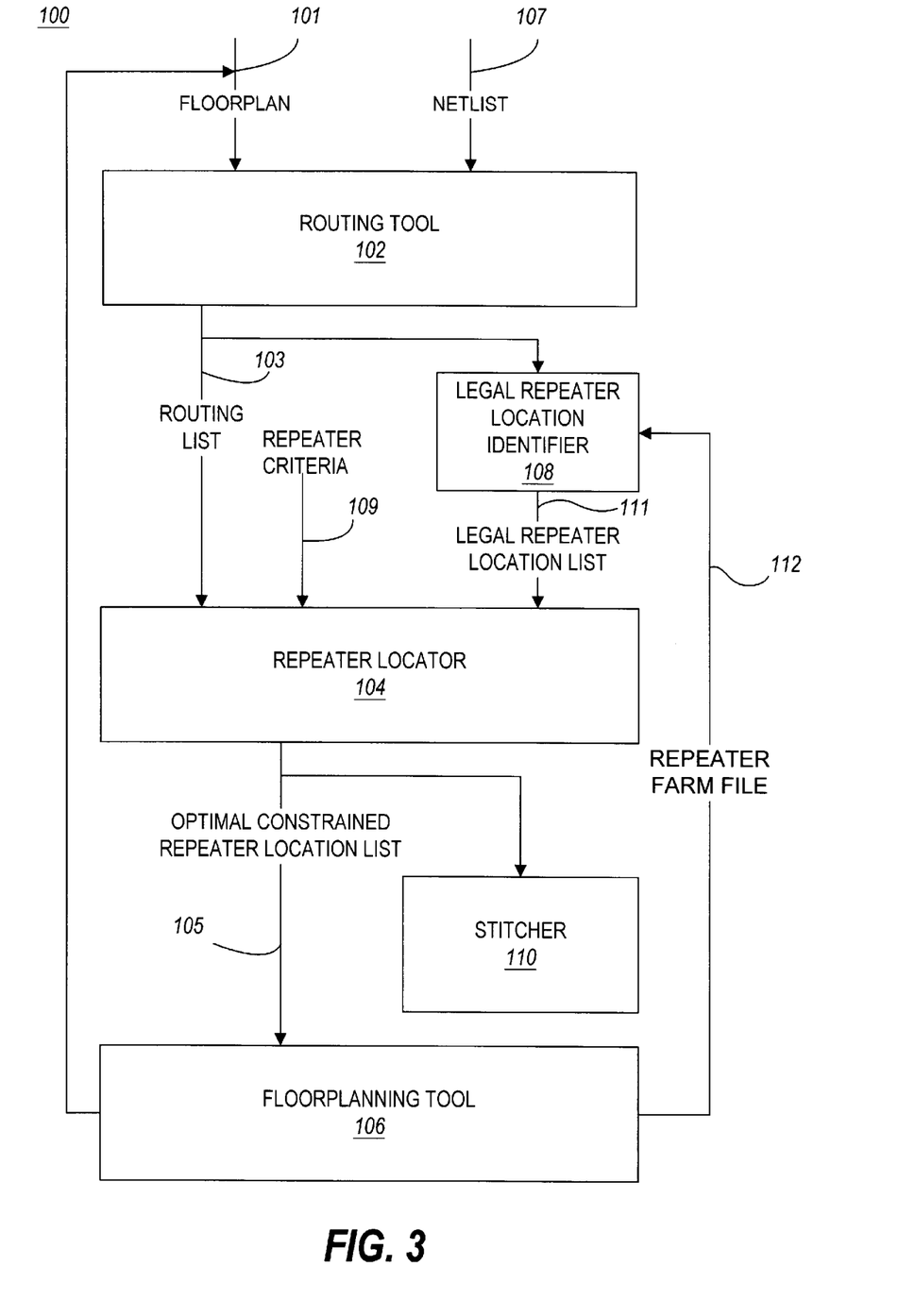
FIG. 3 is a block diagram of an illustrative embodiment of a CAD tool environment in which the method of the invention is implemented.

FIG. 3 is a block diagram of an illustrative embodiment of a CAD tool environment 100 in which the method of the invention is implemented. CAD tool environment 100 may comprise a single software package that implements all of the features shown and described with respect to FIG. 3, or alternatively may comprise several software tools that together implement all the features. CAD tool environment 100 includes a routing tool 102, a repeater locator tool 104, a legal repeater location identifier tool 108, a graphical floorplan tool 106, and a repeater stitcher tool 110. In the illustrative embodiment, routing tool 102 is embodied by IC Craftsman, manufactured by Cadence Corp. Repeater locator tool 104 is embodied by a proprietary tool called SPO which implements the method described in detail in U.S. patent application Ser. No. 09/329,556 to Wanek et al., entitled "Interactive Repeater Insertion Simulator", filed Jun. 10, 1999, and is incorporated herein by reference for all that it teaches. Stitcher tool 110 is embodied in by a software tool implemented in accordance with co-pending U.S. patent application Ser. No. 09/507,442, entitled "Method for Determining Locations Repeater Farms During Physical Design of Integrated Circuits" to Josephson et al, and is incorporated herein by reference for all that it teaches.

Routing tool 102 routes the interconnects defined by a netlist 107 and a floorplan 101 of a previously mapped layout (e.g., using the floorplan tool 106) within the routing regions, which include channels, feedthroughs, and over-the-block regions. Routing tool 102 generates a routing list 103 which defines the interconnect nets generated during the routing process.

Legal repeater location identifier tool 108 determines a set of legal repeater locations for each net in the routing list 103 based on information from the floorplanning tool 106 that describes the legal areas for inserting repeaters. Preferably, this is in the form of a repeater farm file 112 which defines the set aside areas for repeaters. Legal repeater location identifier tool 108 generates a legal repeater location list 111 identifying the set of locations on each net that passes over a repeater farm.

Repeater locator tool 104 implements an algorithm that determines the optimal repeater locations of each interconnect net of routing list 103 when constrained to locations in the net's corresponding legal repeater location set from legal repeater location list 111 and based on a set of user-defined repeater criteria 109 such as propagation delay, transition times, and required repeater size. Repeater locator tool 104 generates a repeater location list 105 containing the optimal constrained locations of repeaters for each net.

Stitcher 110 stitches a repeater in-place on each net at its optimal constrained repeater location as defined in the optimal constrained repeater location list 105.

Graphical floorplan tool 106 provides a positional view of the repeater locations designated in the repeater location list 105 with respect to the overall floorplan map defined by the floorplan 101, netlist 107 and repeater criteria 109 at the locations defined in the repeater location list 105.

Figure 4:
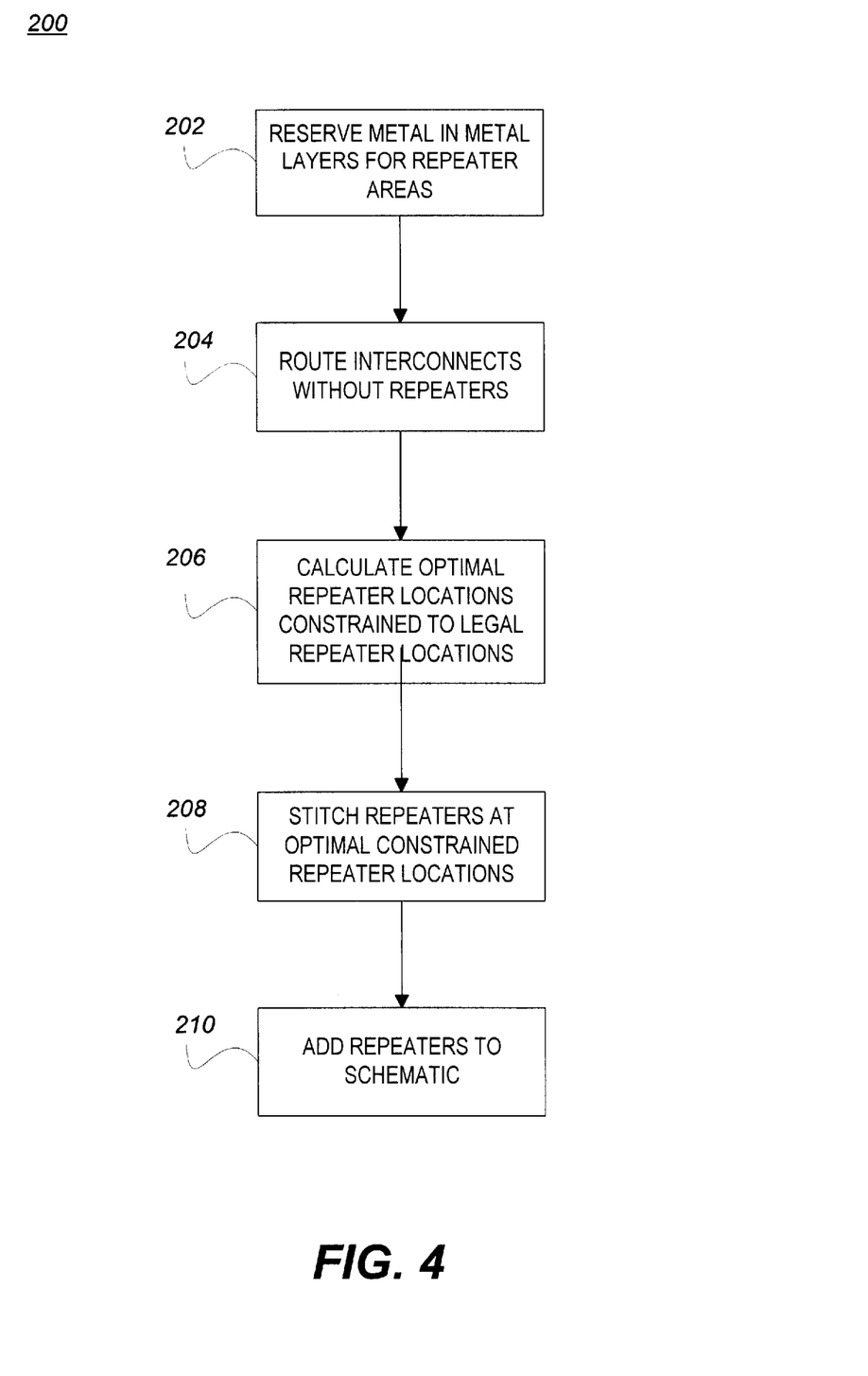
FIG. 4 is an operational flowchart of one embodiment of the method of the invention.

FIG. 4 is a flowchart of the general method 200 of the invention for inserting in-place interconnect repeaters. The method assumes an initial netlist and floorplan defining the circuit layout of the integrated circuit schematic. In accordance with the invention, metal is reserved 202 in the metal layers M1–M6 for repeaters. Preferably, the reserved repeater locations are centrally located in one or more pre-determined repeater areas called repeater farms.

Interconnects are routed 204 without insertion of repeaters to generate an initial route comprising a list of interconnection nets. The optimal constrained repeater locations, defined by the optimal number and locations of repeaters along the interconnect path as constrained by the legal repeater locations of the net, which will result in acceptable timing criteria, are calculated 206 for each interconnect net. In the preferred embodiment, the optimal constrained repeater locations for each interconnect are determined according to U.S. patent application Ser. No. 09/329,556 to Wanek et al., supra.

Figure 5:
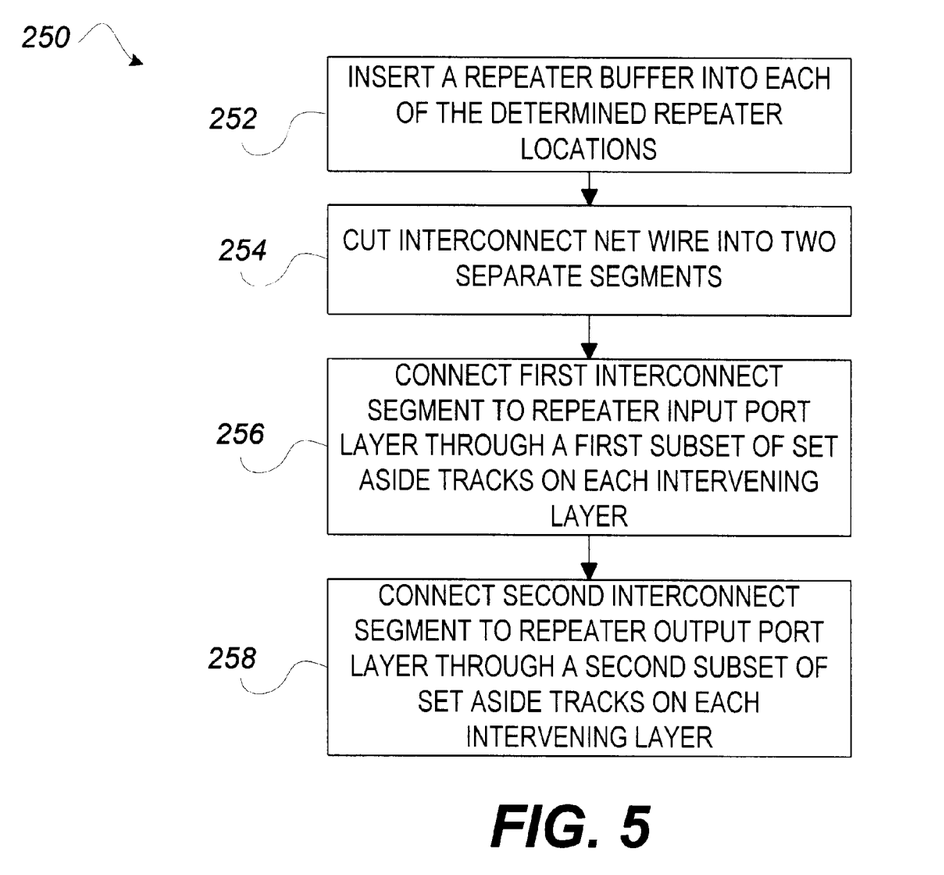
FIG. 5 is an operational flowchart of one embodiment of the method for stitching repeaters in-place into the top-layer interconnect nets.

A repeater is then stitched in-place 208 into the net at each calculated repeater location. Preferably this is accomplished in accordance with the method described in detail in co-pending U.S. patent application Ser. No. 09/570,442, to Josephson et al, entitled "Method For Inserting Repeater Buffers In An Integrated Circuit", which is incorporated by reference herein for all that it teaches. In particular, as shown by the method 250 in FIG. 5, stitcher 110 inserts 252 a repeater buffer into each of the optimal constrained repeater locations, cuts 254 the interconnect net wires into two separate segments, and then connects 256/258 each respective segment of the cut interconnect wire to the respective input and output ports of the repeater buffer through specially set aside tracks on each intervening metal layer.

Once the repeater is stitched in-place, the repeater is then added 210 to the schematic of the integrated circuit.

Preferably, the pre-defined repeater locations reside in pre-determined repeater farm regions. In the preferred embodiment, the positions of the predetermined repeater farms are determined in accordance with the repeater farm locating method of co-pending U.S. patent application Ser. No. 09/507,442, entitled "Method For Determining Locations Of Interconnect Repeater Farms During Physical Design Of Integrated Circuits" to Josephson et al, which is incorporated by reference herein for all that it teaches.

Figure 6:
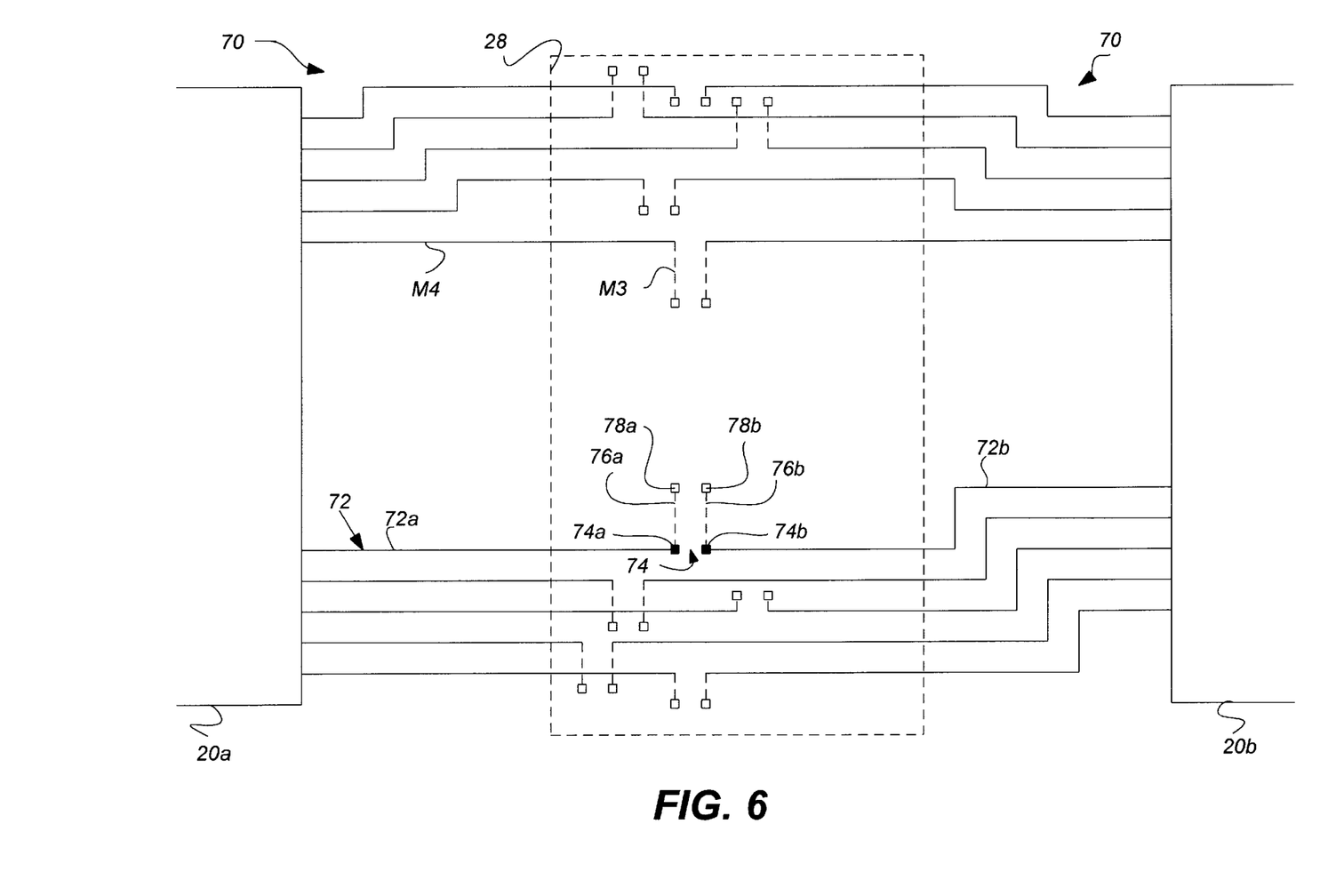
FIG. 6 is a top-level floorplan view of a portion of the IC of FIG. 1 showing the two metal layers illustrating the results of the in-place repeater stitching methodology of the invention.

Turning now to FIG. 6, there is illustrated a top-level view of the floorplan of a portion of IC 10 showing the channel 70 between functional blocks 20a and 20b. In this example view, metal layers M4 and M3 are illustrated. M4 tracks run horizontally in parallel as shown by the solid lines. M3 tracks run vertically (in this view) and are shown by dotted lines. Also in this example, a repeater farm 28 has been defined approximately through the center of the channel 70. As described previously, in the preferred embodiment, all access to repeaters is constrained to portions of tracks residing within the boundaries of predefined repeater farm areas such as the farm shown at 28. As illustrated, a repeater (not shown) has been inserted along interconnect 72. Accordingly, interconnect 72 has been cut between section 74 into two separate nets 72a and 72b. Net 72a connects at node 74a to net 76a on layer M3, which connects to the input port of a repeater (not shown) at node 78a. Net 72b connects at node 74b to net 76b on layer M3, which connects to the output port of the same repeater (not shown) at node 78b. Each of the other interconnects illustrated are stitched similarly.

It will be appreciated from the above detailed description that the method for performing in-place insertion of repeater buffers along interconnect routing paths of an integrated circuit achieve several advantages over the prior art. First, the use of in-place repeater insertion eliminates the need for the iterative rip-up and re-routing process used in the prior art. This saves time and simplifies the schematic since the router places the route and the net is virtually unaffected with the exception that the interconnect wire is broken at the interconnect layer and the repeater is placed between the two broken wire ends. In other words, the net is not rerouted. Second, constraint of repeater locations to predefined legal repeater areas effectively decreases the potential length of the path between the interconnect net and repeater, which assists in reducing the signal propagation delay.

Although the invention has been described in terms of the illustrative embodiments, it will be appreciated by those skilled in the art that various changes and modifications may be made to the illustrative embodiments without departing from the spirit or scope of the invention. It is intended that the scope of the invention not be limited in any way to the illustrative embodiment shown and described but that the invention be limited only by the claims appended hereto.

What is claimed is:

1. An in-place method for inserting interconnect repeaters in an integrated circuit, said integrated circuit comprising a silicon layer, an interconnect layer layered over said silicon layer, and zero or more intervening layers layered between said interconnect layer and said silicon layer, said method comprising the steps of:

defining a set of legal repeater areas on said interconnect layer;

reserving metal on each of said interconnect layer and said zero or more intervening layers for connecting repeaters implemented on said silicon layer to interconnects passing over said defined set of legal repeater areas;

routing at least one interconnect without inserting repeaters, said at least one interconnect passing over at least one of said defined set of legal repeater areas;

calculating a set of optimal constrained repeater locations for said at least one interconnect, said optimal constrained repeater locations defined by the optimal number and locations of repeaters along said at least one interconnect as constrained to said at least one of said defined set of legal repeater areas over which said at least one interconnect passes and which will result in acceptable timing criteria; and stitching a repeater in-place at each of said optimal constrained repeater locations associated with said at least one interconnect.

2. The method of claim 1, comprising:

adding said stitched repeaters to a schematic of said integrated circuit.

3. The method of claim 1, wherein said stitching step comprises:

for each of said optimal constrained repeater locations:
inserting a repeater buffer into said silicon layer at said optimal constrained repeater location, said repeater buffer comprising a repeater input port and a repeater output port;
cutting said interconnect into a separate first and second interconnect segment; and
connecting said first interconnect segment to said repeater input port layer through a first subset of said reserved tracks on each intervening layer; and
connecting said second interconnect segment to said repeater output port layer through a second subset of said reserved tracks on each intervening layer.

4. A system for performing in-place insertion of interconnect repeaters in an integrated circuit, said integrated circuit comprising a silicon layer, an interconnect layer layered over said silicon layer, and zero or more intervening layers layered between said interconnect layer, said integrated circuit comprising a set of predefined legal repeater location areas and metal reserved on each layer for connecting repeaters implemented on said silicon layer to interconnects passing over said set of predefined legal repeater location areas, said system comprising:

a repeater locator which receives a routing list comprising at least one interconnect that passes over at least one of said predefined legal repeater location areas and calculates a set of optimal constrained repeater locations for said at least one interconnect, said optimal constrained repeater locations defined by the optimal number and locations of repeaters along for said at least one interconnect as constrained to said at least one of said predefined legal repeater location areas over which said at least one interconnect passes and which will result in acceptable timing criteria; and a repeater stitcher which stitches a repeater in-place, using said reserved metal on each layer, at each of said optimal constrained repeater locations associated with said at least one interconnect.

5. A system in accordance with claim 4, comprising:

a router which routes said at least one interconnect without inserting repeaters and generates said routing list.

* * * * *